(12) United States Patent
Lam et al.

(10) Patent No.: US 9,496,145 B2
(45) Date of Patent: Nov. 15, 2016

(54) ELECTROCHEMICAL PLATING METHODS

(71) Applicant: APPLIED Materials, Inc., Santa Clara, CA (US)

(72) Inventors: John W. Lam, San Jose, CA (US); Ismail Emesh, Sunnyvale, CA (US); Roey Shaviv, Palo Alto, CA (US)

(73) Assignee: APPLIED Materials, Inc., Santa Clara, CA (US)

( * ) Notice: Subject to any disclaimer, the term of this patent is extended or adjusted under 35 U.S.C. 154(b) by 34 days.

(21) Appl. No.: 14/219,940

(22) Filed: Mar. 19, 2014

(65) Prior Publication Data

US 2015/0270133 A1 Sep. 24, 2015

(51) Int. Cl.
*H01L 21/44* (2006.01)
*H01L 21/288* (2006.01)
*H01L 21/768* (2006.01)
*C25D 7/12* (2006.01)
*H01L 21/324* (2006.01)
*H01L 23/532* (2006.01)

(52) U.S. Cl.
CPC ......... *H01L 21/2885* (2013.01); *C25D 7/123* (2013.01); *H01L 21/3247* (2013.01); *H01L 21/76873* (2013.01); *H01L 21/76879* (2013.01); *H01L 21/76882* (2013.01); *H01L 21/76883* (2013.01); *H01L 23/53257* (2013.01); *H01L 2924/0002* (2013.01)

(58) Field of Classification Search
CPC ............. H01L 21/2885; H01L 21/324; H01L 21/76883; H01L 21/76879; C25D 7/123
USPC ....................................................... 438/678
See application file for complete search history.

(56) References Cited

U.S. PATENT DOCUMENTS

| | | | |
|---|---|---|---|
| 6,720,263 B2 | 4/2004 | Olgado et al. | |
| 6,808,612 B2 | 10/2004 | Hey et al. | |
| 6,913,680 B1 | 7/2005 | Zheng et al. | |
| 7,279,408 B2 | 10/2007 | Inoue et al. | |
| 7,794,530 B2 | 9/2010 | Vaskelis et al. | |

(Continued)

FOREIGN PATENT DOCUMENTS

| | | |
|---|---|---|
| JP | 2003-328184 A | 11/2003 |
| KR | 10-1182155 B1 | 9/2012 |
| WO | 2006102318 A2 | 9/2006 |

OTHER PUBLICATIONS

Korean Intellectual Property Office, The International Search Report and The Written Opinion of the International Searching Authority (Jun. 30, 2015).

*Primary Examiner* — Julio J Maldonado
*Assistant Examiner* — Cory Eskridge
(74) *Attorney, Agent, or Firm* — Kenneth H. Ohriner; Perkins Coie LLP

(57) ABSTRACT

An electrochemical process for applying a conductive film onto a substrate having a seed layer includes placing the substrate into contact with an electrochemical plating bath containing cobalt or nickel, with the plating bath having pH of 4.0 to 9.0. Electric current is conducted through the bath to the substrate. The cobalt or nickel ions in the bath deposit onto the seed layer. The plating bath may contain cobalt chloride and glycine. The electric current may range from 1-50 milli-ampere per square cm. After completion of the electrochemical process, the substrate may be removed from the plating bath, rinsed and dried, and then annealed at a temperature of 200 to 400 C to improve the material properties and reduce seam line defects. The plating and anneal process may be performed through multiple cycles.

12 Claims, 7 Drawing Sheets

Seed Layer

Partial fill with Super conformal ECD

(56) References Cited

U.S. PATENT DOCUMENTS

| | | |
|---|---|---|
| 7,846,306 B2 | 12/2010 | Hafezi et al. |
| 8,563,424 B2 | 10/2013 | Ganguli et al. |
| 2002/0084529 A1 | 7/2002 | Dubin et al. |
| 2002/0127847 A1 | 9/2002 | Alling et al. |
| 2004/0198055 A1* | 10/2004 | Wang ................ H01L 21/2885 438/692 |
| 2006/0035016 A1* | 2/2006 | Tiwari .................. C23C 18/32 427/97.9 |
| 2007/0105377 A1* | 5/2007 | Koos .................. C23C 18/1608 438/689 |
| 2009/0053426 A1 | 2/2009 | Lu et al. |
| 2010/0013107 A1* | 1/2010 | Sandhu ............ H01L 21/76816 257/777 |
| 2011/0163449 A1* | 7/2011 | Kelly ................ H01L 21/2885 257/750 |
| 2012/0153483 A1 | 6/2012 | Akolkar et al. |
| 2014/0008812 A1 | 1/2014 | Emesh |

* cited by examiner

Non plated structure with PVD
Ta/Cu seed layer only.

Conformal ECD Co on PVD Ta/Cu
seed layer using cobalt-glycine chemistry at pH 6.5.

Conformal ECD Co on TaN/Co seed
with seam line defects using cobalt-glycine
chemistry at pH 6.5.

Thermal treatment of ECD Co on
TaN/Co seed. Seam line minimized after anneal

Conformal ECD Co on CVD Co seed
using cobalt-EDA chemistry at pH 8.5.

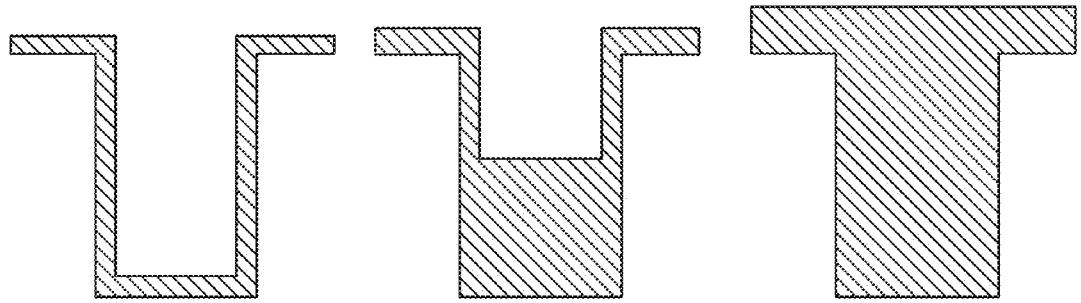
Seed Layer
FIG. 6A
Partial fill with Super conformal ECD
FIG. 6B
Seam free fill with Super conformal ECD
FIG. 6C
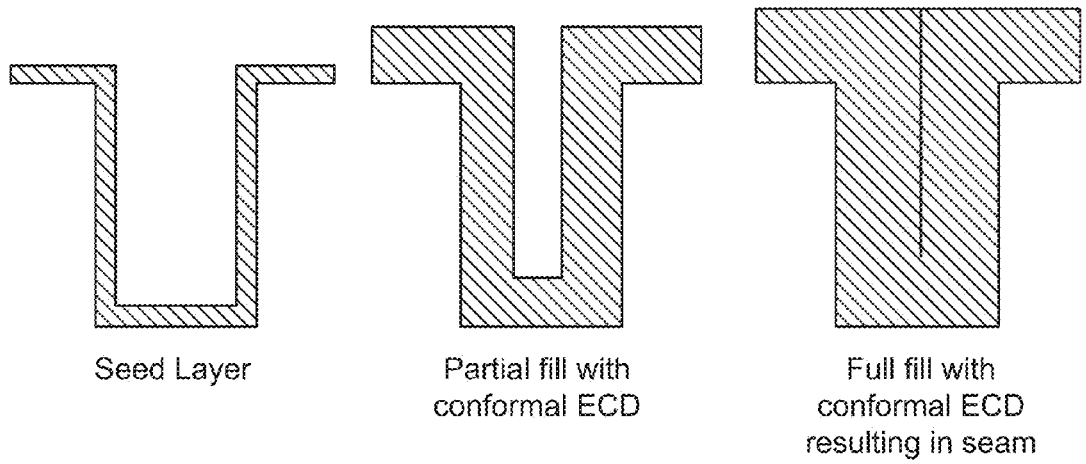
Seed Layer
FIG. 7A
Partial fill with conformal ECD
FIG. 7B
Full fill with conformal ECD resulting in seam
FIG. 7C Seed Layer      Full fill with conformal ECD     Seam free fill after annealing

ELECTROCHEMICAL PLATING METHODS

The field of the invention is methods for electrochemically processing micro-scale work pieces, wafers or substrates.

BACKGROUND OF THE INVENTION

Microelectronic devices, such as micro-scale electronic, electro-mechanical or optical devices are generally fabricated on and/or in work pieces or substrates, such as silicon wafers. In a typical fabrication process, for example on a semiconductor material wafer, a conductive seed layer is first applied onto the surface of the substrate using chemical vapor deposition (CVD), physical vapor deposition (PVD), electro less plating processes, or other suitable methods. After forming the seed layer, a blanket layer or patterned layer of metal is plated onto the substrate by applying an appropriate electrical potential between the seed layer and one or more electrodes in the presence of an electro processing solution containing metal ions. The substrate is then cleaned, etched and/or annealed in subsequent procedures, to form devices, contacts or conductive lines. Some substrates may have a barrier layer with the seed layer formed on the barrier layer.

Currently, most micro-electronic devices are made on substrates plated with copper. Although copper has high conductivity, it typically requires a barrier layer such as tantalum nitride (TaN) to prevent diffusion of copper into the substrate or dielectric material on the substrate. These types of barrier layer have relatively low conductivity. Using known techniques, features on the substrate are filled with electroplated copper using acid copper chemistries or electroplating solutions. These chemistries often use additives to promote a super conformal fill process (with the features filling primarily from the bottom up, rather than inwardly from the sides) and create a void-free fill. As the feature sizes shrink, achieving void free fill with the traditional copper plating processes has become more difficult. Also as the features get smaller, the barrier layer required for copper occupies a larger volume, because a minimum barrier layer thickness must be maintained to prevent copper diffusion, regardless of feature size.

For example if a minimum barrier layer thickness of 3 nm is required to prevent diffusion of copper, then for a feature having a 60 nm critical dimension with an aspect ratio of 4:1, the barrier layer occupies roughly 11% of the cross-sectional area. However, with a feature a having a 20 nm critical dimension with an aspect ratio of 2:1, the barrier layer must remain 3 nm thick, but it now occupies 33% of the cross sectional area. In this case the volume of the barrier layer (which has low conductivity) is proportionally higher, so the resistance of the interconnect, via or other feature is proportionally higher. With progressively smaller features, the proportion of copper to barrier layer increases, to the extent that the resistance becomes unacceptable.

One approach proposed for overcoming this technical challenge is to replace copper with a metal that does not require a barrier layer, such as cobalt. Although cobalt has a higher resistance than copper (6 uOhm-cm for cobalt versus 2 uOhm-cm for copper), cobalt does not require a barrier layer because it does not diffuse into the silicon or dielectric. U.S. Patent Application Publication No. 20130260555 describes filling large and small features by applying cobalt via CVD. Although this method works well for smaller features, e.g., of 7-10 nm, CVD is not well suited for filling features larger than about 10 nm. Improved techniques are needed.

BRIEF DESCRIPTION OF THE DRAWINGS

FIGS. 6A-6C are schematic diagrams of super conformal fill.

FIGS. 7A-7C are schematic diagrams of conformal fill.

DETAILED DESCRIPTION

Various known cobalt plating methods using acid and alkaline cobalt baths have been proposed. See for example U.S. Patent Application Publication No. 2014-/0008812. However, plating cobalt onto substrates having very small features, for example features of 60 nm, 40 nm, 30 nm or less, presents different challenges. Substrates with very small features necessarily have a very thin seed layer. Using known cobalt plating methods on these substrates will usually dissolve the very thin seed layer, preventing proper plating. The present methods use a cobalt bath with a specific pH range to minimize corrosion of the seed layer.

Nickel has plating characteristics similar to cobalt. The described uses of cobalt may be applied as well to use of nickel instead of cobalt. References here to interconnects includes other features used on or in substrates, such as trenches, holes and vias.

Deposition of a metal inside a sub-micron interconnect may be achieved by electrochemical deposition on a conductive substrate. The plated metal can be selected from a list including copper, cobalt, nickel, gold, silver or platinum. Conformal and super conformal electrochemical deposition of the metal may be followed by an optional thermal treatment.

A neutral to alkaline aqueous solution may be used for deposition of the electrochemically plated metal. For example, cobalt or nickel complex plating solutions may be used to electrochemically deposit cobalt or nickel into sub-micron interconnects or other features on a substrate. The substrate may be provided with a seed layer formed via electro less deposition, physical vapor deposition, or chemical vapor deposition. Materials used in the seed layer may include copper, manganese doped copper, ruthenium (Ru), and others. Cobalt silicide or nickel silicide may also be used in the seed layer. The barrier layer on the substrate, if any, may be applied via chemical vapor deposition (CVD) or using other known techniques.

The electroplating or electrochemical deposition process may be followed by an annealing step to improve the material properties of the electrochemically plated cobalt or nickel, and to reduce seam line voids associated with conformal electroplating. In the present methods, annealing after plating may be performed at temperatures lower than used for traditional copper processes. The anneal step stabilizes the plated film. It may also help remove seam lines and micro voids from the conformal plating process. The anneal step may also improve film properties by driving out impurities that can be trapped due to the plating conditions. With some applications, depending on specific plating conditions and chemistries, the anneal step may be omitted. For example a cobalt plating solution that promotes super conformal growth and incorporates low impurities may not need an anneal step.

A. Electrochemical Deposition Using Cobalt i. Overview

Figure 4E:
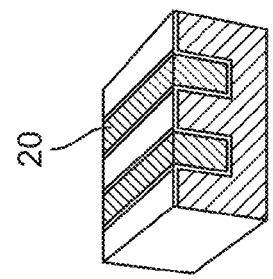
FIGS. 4A-4E are schematic diagrams of an embodiment of the present methods.
Figure 4D:
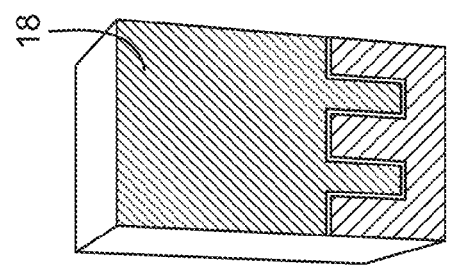
Figure 4C:
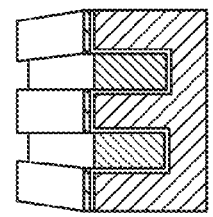
Figure 4B:
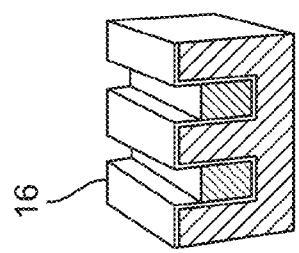
Figure 4A:
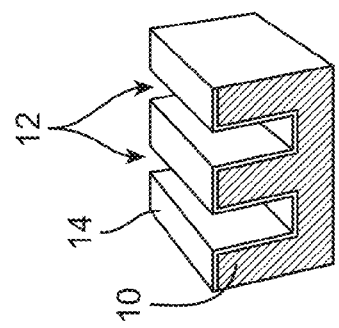

Methods of the invention are diagrammatically shown in FIGS. 4A-4E. In FIG. 4A, a substrate 10, such as a silicon wafer has features 12 and a conductive seed layer 14. A barrier layer (not shown) may be provided under the seed layer 14 in some applications. In FIG. 4B, a cobalt or nickel conformal or super conformal film 16 is plated onto the seed layer 14. The film 16 may partially or fully fill the features, with FIG. 4B showing the film 16 partially filling the features 12. The thickness of the film 16 is sufficient to provide an at least 10, 20, 30, 40 or 50% fill of the features (in contrast to the seed layer 14 which provides virtually no significant fill). The barrier layer may optionally be PVD TaN, ALD TaN, PVD TiN, ALD TiN, ALD MnN, CVD MnN, CVD NiSi or CoSi, where PVD is physical vapor deposition, CVD is chemical vapor deposition and ALD is atomic layer deposition.

FIG. 4C shows annealing with the film 16 reflowing to further fill the features 12. FIG. 4D shows deposition of a capping or metallization layer 18, which may be the same metal (cobalt or nickel as used for the film 16), or a different metal. FIG. 4E shows the substrate after chemical mechanical polishing, with the capping layer 18 selectively removed leaving filled features 20.

The film 16 may be electro plated onto the seed layer 14 using a neutral to alkaline cobalt plating solution ranging from pH 4 to pH 9. The plating solution may contain a chelating agent such as citrate, glycine, tartrate, ethylene diamine, etc.

Figures 8A, 8B, 8C:
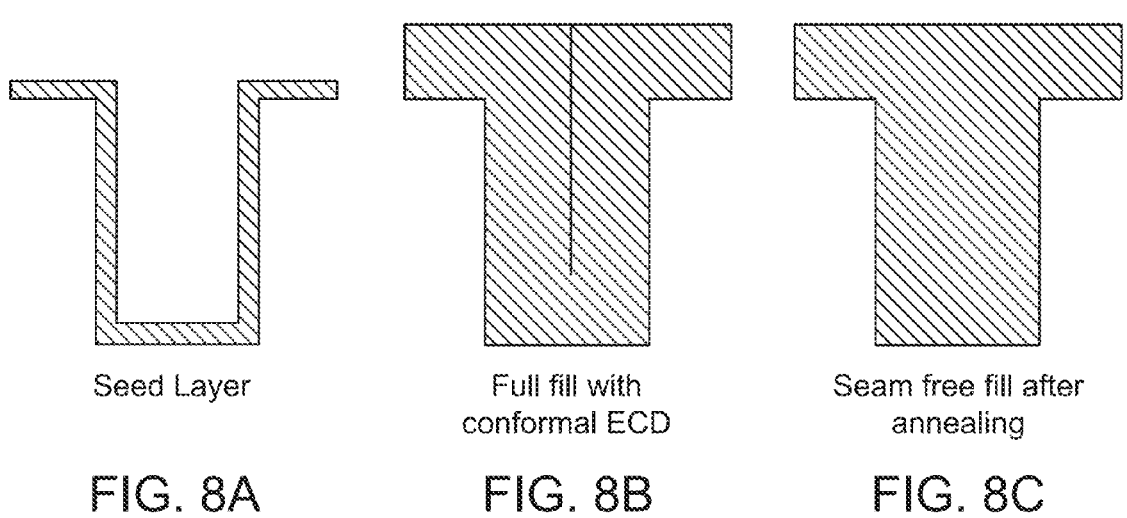
FIGS. 8A-8C schematic diagrams of conformal fill followed by annealing.

FIGS. 6A-6C illustrate super conformal filling of a feature on a substrate, such as a trench or via. FIG. 6A shows the seed layer. FIG. 6B shows a partial fill with super conformal ECD. FIG. 6C shows a seam free fill with super conformal ECD. As shown, the feature largely fills up from the bottom, rather than inwardly from the sides, providing a seam-free plated feature. Filling may also be performed by plating a conformal film followed by an annealing step, or by another layer of super conformal film. FIGS. 7A-7C show conformal filling where the feature is largely filled inwardly from the sides, with a seam in the filled feature, similar to FIGS. 6A-6C. FIGS. 8A-8C show the same process as in FIGS. 7A-7C, but with the filled feature seam-free after annealing, with FIG. 8A showing the seed layer, FIG. 8B showing full fill with conformal ECD, and FIG. 8C showing a seam-free fill after annealing. Conformal or super conformal plating may be used in performing the described methods.

ii. Detailed Process Description

Figure 1A:
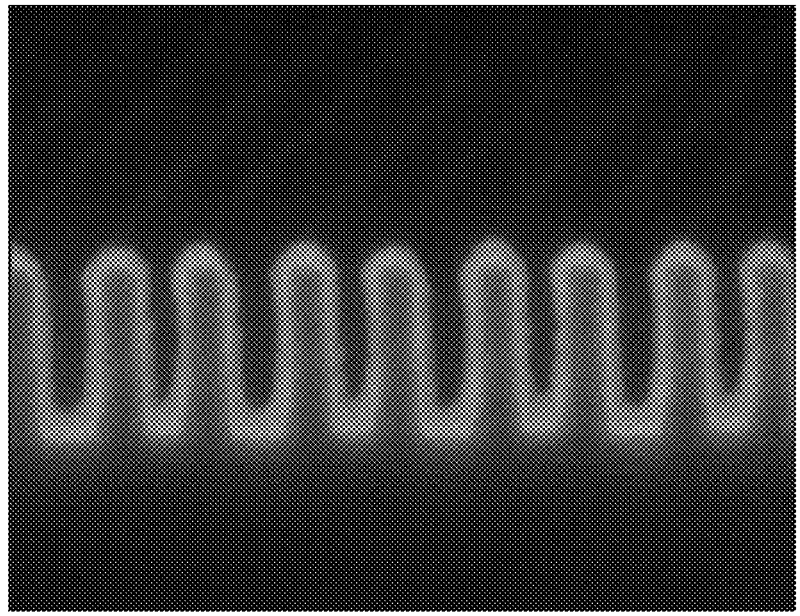
FIG. 1A is a scanning electron microscope (SEM) image of an unfilled or unplated structure on a substrate having a TaN barrier layer and a Cu seed layer. In some applications the barrier layer may be other materials, such as TiN, or there may be no barrier layer. The seed layer may also be CVD cobalt.
Figure 2A:
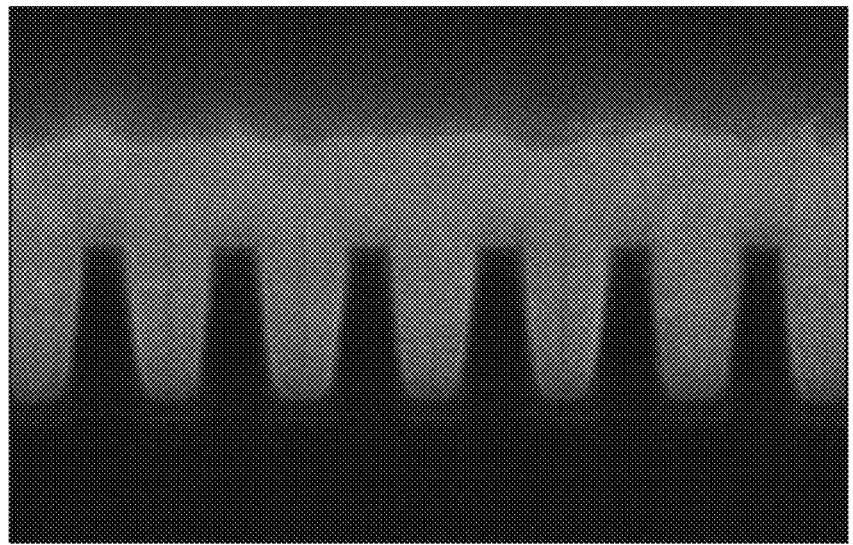
FIG. 2A is a SEM image of a similar structure electroplated with cobalt on a TaN/Co seed layer using a cobalt-glycine plating bath having a pH of 6.5, with seam line defects showing.
Figure 3:
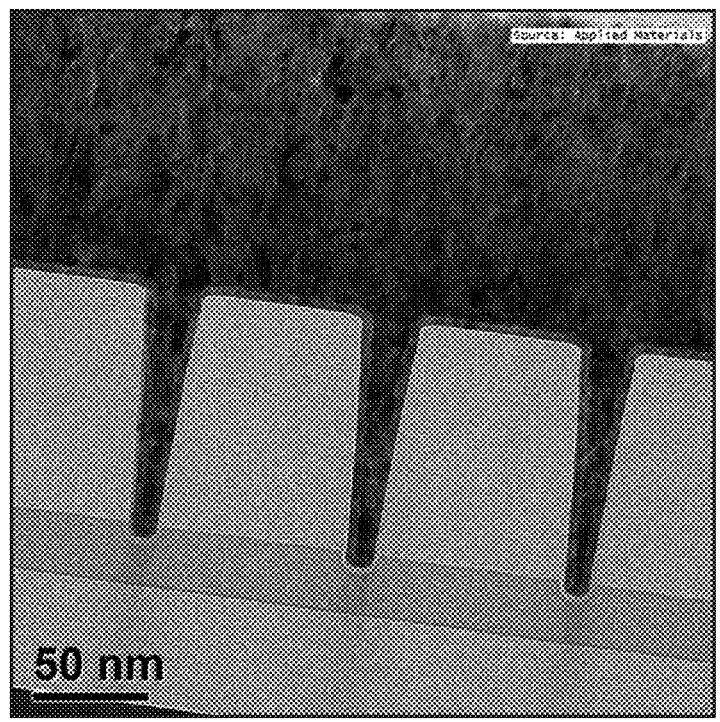
FIG. 3 is SEM image of another structure electroplated with cobalt on a CVD Co seed layer using a cobalt-EDA plating bath having a pH of 8.5.

1. The substrate is provided with a conductive seed layer such as CVD or electro-less cobalt, although others such as copper, nickel, gold, silver, palladium and/or ruthenium may be used. FIG. 1A shows an example of an unfilled feature with a barrier layer such as TaN applied onto the substrate and a copper seed layer on the barrier layer. FIG. 2A shows conformal electrochemical deposition (ECD) of cobalt on substrate having a cobalt CVD layer on a TaN barrier, with seam line defects apparent. FIG. 3 shows an example of conformal ECD cobalt on a CVD cobalt seed layer.

Figure 1B:
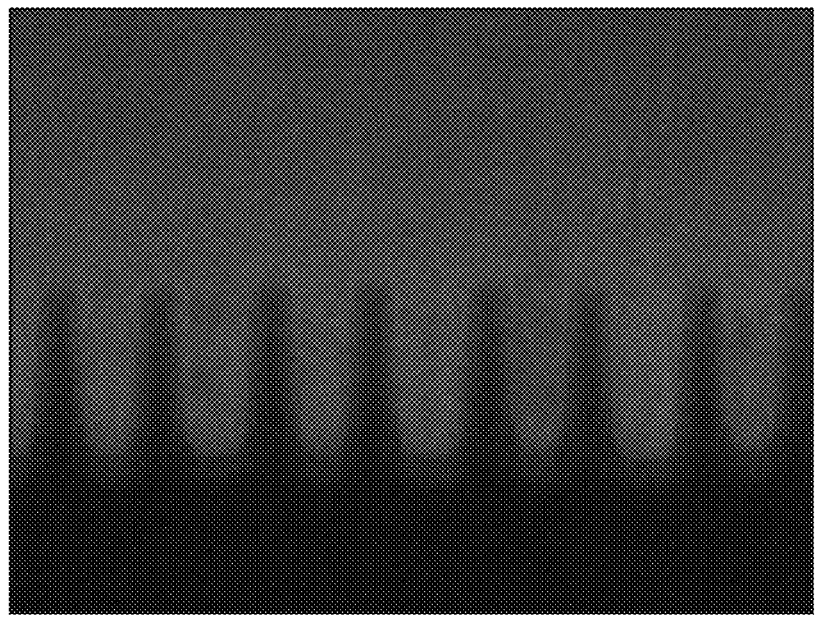
FIG. 1B shows the structure of FIG. 1 now filled with electrochemically deposited cobalt from an alkaline plating bath.
Figure 2B:
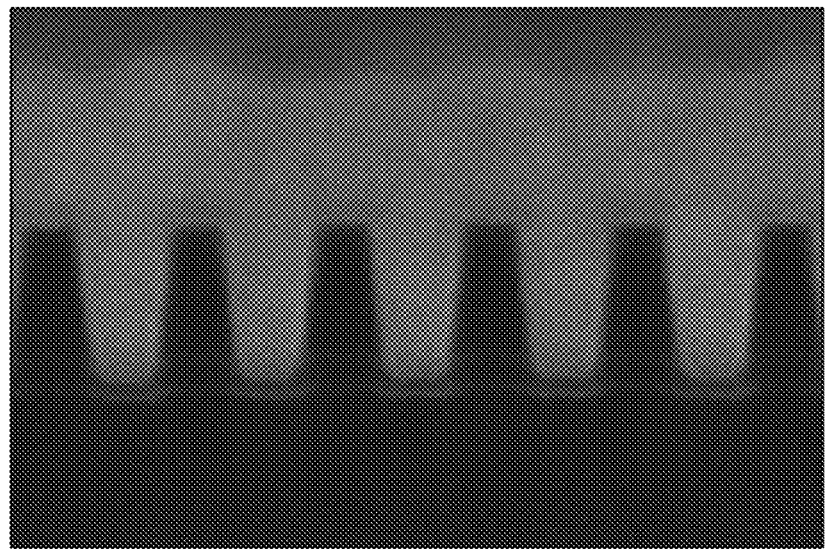
FIG. 2B shows the structure of FIG. 2A after annealing, with the seam line minimized or eliminated.

2. A pre-plating treatment may be used, i.e., reducing agents such as He/H2, forming gases, etc. may be applied to the substrate, before plating. The structure may be electroplated with cobalt in a plating bath that is mildly acidic, neutral or basic. In the examples of FIGS. 1b, 2a, and 2b, a cobalt chloride and glycine bath at pH 6.5 was used for cobalt deposition. In FIG. 3, a cobalt chloride and EDA bath at pH 8.5 was used for cobalt deposition. The current density used for the electrochemical deposition process may range from 1-50 milli-ampere per square cm.

3. A neutral to alkaline plating solution may be used when the seed layer is more susceptible to corrosion, such as with CVD cobalt seed layers. Full coverage of electrochemical deposition of cobalt on a cobalt seed layer applied via chemical vapor deposition may generally be obtained when the pH is increased from 6.5 to 8.3. The plating bath may alternatively have a pH in one of the following ranges: 7.5 to 8.5; 7.8 to 8.5; 8.0 to 8.5; or 7.8 to 9.0.

4. After conformal or super conformal electrochemical deposition of cobalt is completed, the substrate may be thermally treated at temperatures of 200 C to 450 C to improve the material properties and/or reduce seam line defects. FIG. 2b shows a substrate after annealing at 350 C in a H2/He environment. The seam line is no longer visible in the scanning electron microscope image. Other gases such as N2/He or pure H2 may alternatively be used. Surface roughness is also improved after the annealing process as shown in FIG. 2b.

A multi plate multi anneal process may be performed by filling the features with a slow plating process, then annealing to improve the material properties, followed by depositing the capping layer 18 for chemical mechanical polishing. Plated cobalt may be used for the capping layer 18. In a multi plate process having first and second plating steps providing first and second films on the substrate, after annealing the substrate, for example at a temperature of 200-450 C, a third plating step may be performed to provide a metallization layer on the second film. The metallization layer may then be chemically mechanically polished.

iii. Test Results

Features ranging 60 nm-25 nm have been filled using the methods described. Test results show successful plating on thin seed layers having a high sheet resistance, i.e., on 200 ohm/sq seed layer on 300 mm wafers. This type of seed layer, which would typically rapidly corrode in a conventional acid copper plating solution, is not significantly etched or corroded using the cobalt or nickel plating solutions described above. Test results also demonstrate successful plating of a cobalt film on a 6 nm CVD cobalt seed layer, using a mildly acid to alkaline cobalt plating solution.

Figure 5:
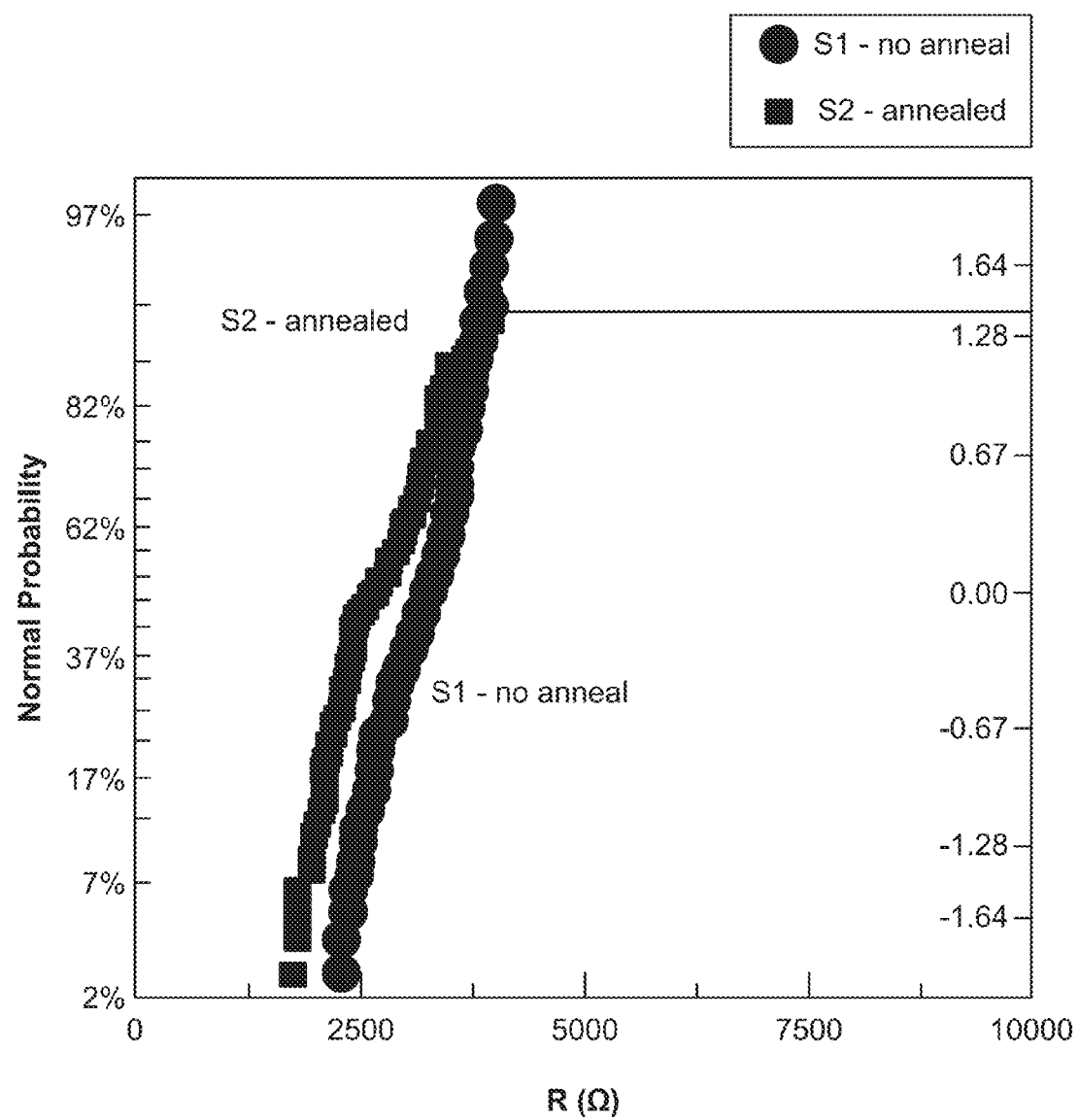
FIG. 5 is a graph of test data of line resistance after annealing.

Test data also show a decrease in line resistance and blanket film resistance with anneal treatment after plating, as shown in FIG. 5. A multi plate multi anneal process on substrates having a CVD cobalt seed layer has also been performed. One example of a multi plating process is to fill the features with a slow plating solution, and then move the substrate to another chamber for a fast plating of the cap or metallization layer 18, in advance of chemical mechanical polishing.

B. Electrochemical Deposition Using Nickel

The methods and parameters described above may also be used with nickel.

In contrast to a CVD only process, the methods described above provide for much higher through put and decreased cost, so that they are well designed for high volume manufacturing. Thus, novel methods have been shown and described. Various changes and substitutions may of course be made without departing from the spirit and scope of the invention. The invention, therefore, should not be limited, except by the following claims and their equivalents.

The invention claimed is:

1. An electrochemical process, comprising:
   placing a substrate having a cobalt seed layer into contact with an electrochemical plating bath containing cobalt salts, with the plating bath having pH of greater than 5 and up to 9;
   conducting electric current through the bath to reduce cobalt ions in the plating bath and deposit a conformal film of cobalt onto the cobalt seed layer; and
   annealing the substrate at a temperature of 200 to 450 C.

2. The method of claim 1 with the bath containing glycine.

3. The method of claim 1 with the plating bath having a pH of 6.5 to 8.3.

4. The method of claim 1 with the electric current ranging from 1-50 milli-ampere per square cm.

5. The method of claim 1 wherein the annealing is performed in an environment of H2/He, N2/H2, a reducing gas, pure hydrogen, or ammonia.

6. The method of claim 1 wherein the plating bath has a pH of 6.0 to 9.0.

7. The method of claim 1 wherein the cobalt is deposited into sub-micron features on the seed layer and the annealing causes the conformal film to fill the features without seam line defects.

8. The method of claim 1 with the seed layer on a barrier layer on the substrate.

9. The method of claim 1 with the substrate having no barrier layer.

10. The method of claim 1 wherein the plating bath does not substantially corrode or etch the seed layer.

11. The method of claim 1 further including repeating the steps at least once to provide a multi-step multi-cycle electrochemical deposition and anneal process.

12. The method of claim 11 further including plating, and drying annealing the substrate through at least two cycles.

* * * * *